(12) United States Patent
Shimonaka

(10) Patent No.: US 6,842,472 B1
(45) Date of Patent: Jan. 11, 2005

(54) SEMICONDUCTOR LASER ELEMENT AND ELECTRONIC DEVICE USING THE SAME

(75) Inventor: Atsushi Shimonaka, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 71 days.

(21) Appl. No.: 09/670,820

(22) Filed: Sep. 28, 2000

(30) Foreign Application Priority Data

Sep. 28, 1999 (JP) .............................................. 11-275399
Sep. 19, 2000 (JP) ........................................ 2000-284429

(51) Int. Cl.[7] .............................................. H01S 5/00
(52) U.S. Cl. .............................. 372/50; 372/97; 372/68; 372/43; 372/44; 385/28
(58) Field of Search .............................. 372/68, 66, 46, 372/50, 97; 385/45, 46, 28, 17

(56) References Cited

U.S. PATENT DOCUMENTS

| | | | | |
|---|---|---|---|---|
| 4,827,482 A | * | 5/1989 | Towe et al. ..................... | 372/44 |
| 5,379,311 A | * | 1/1995 | McFarlane et al. ......... | 359/326 |
| 6,205,163 B1 | * | 3/2001 | Hamamoto .................. | 372/43 |
| 6,228,670 B1 | * | 5/2001 | Kudo .......................... | 438/31 |
| 6,411,642 B1 | * | 6/2002 | Mazed ....................... | 372/102 |

FOREIGN PATENT DOCUMENTS

JP    A1168242    3/1999

OTHER PUBLICATIONS

"Applied Physics Letters" by L. J. Mawst et al., vol. 60, No. 6, pp. 668–670, Feb. 10, 1992.

* cited by examiner

*Primary Examiner*—Tom Thomas
*Assistant Examiner*—Matthew C. Landau
(74) *Attorney, Agent, or Firm*—Birch, Stewart, Kolasch & Birch, LLP

(57) ABSTRACT

A semiconductor laser element includes: a semiconductor laser region in which at least one laser emission portion including an active layer for emitting light is provided; a multimode interference region including a first wave-guiding layer, one end of the first wave-guiding layer being optically coupled to the active layer of the at least one laser emission portion; and an output waveguide region including a second wave-guiding layer, the second wave-guiding layer being optically coupled to another end of the first wave-guiding layer, wherein the active layer of the at least one laser emission portion, the first wave-guiding layer, and the second wave-guiding layer are integrally formed.

21 Claims, 10 Drawing Sheets

FIG.10A
FIG.10B
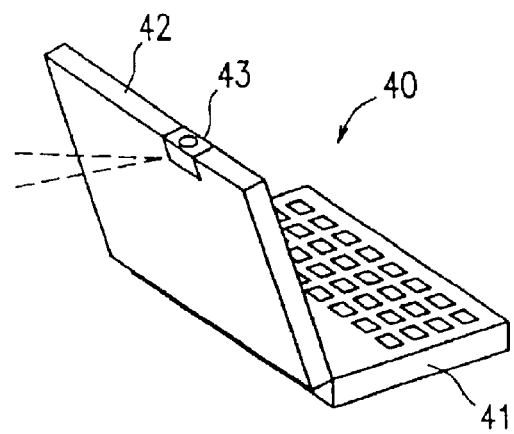
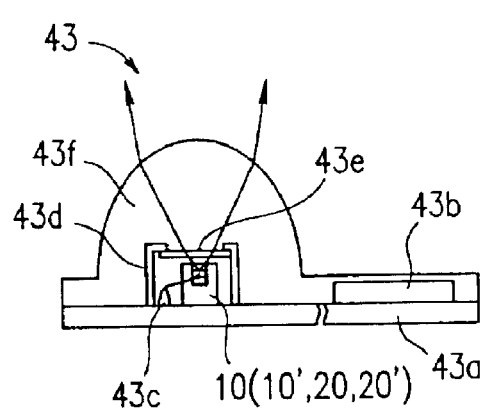
FIG.11
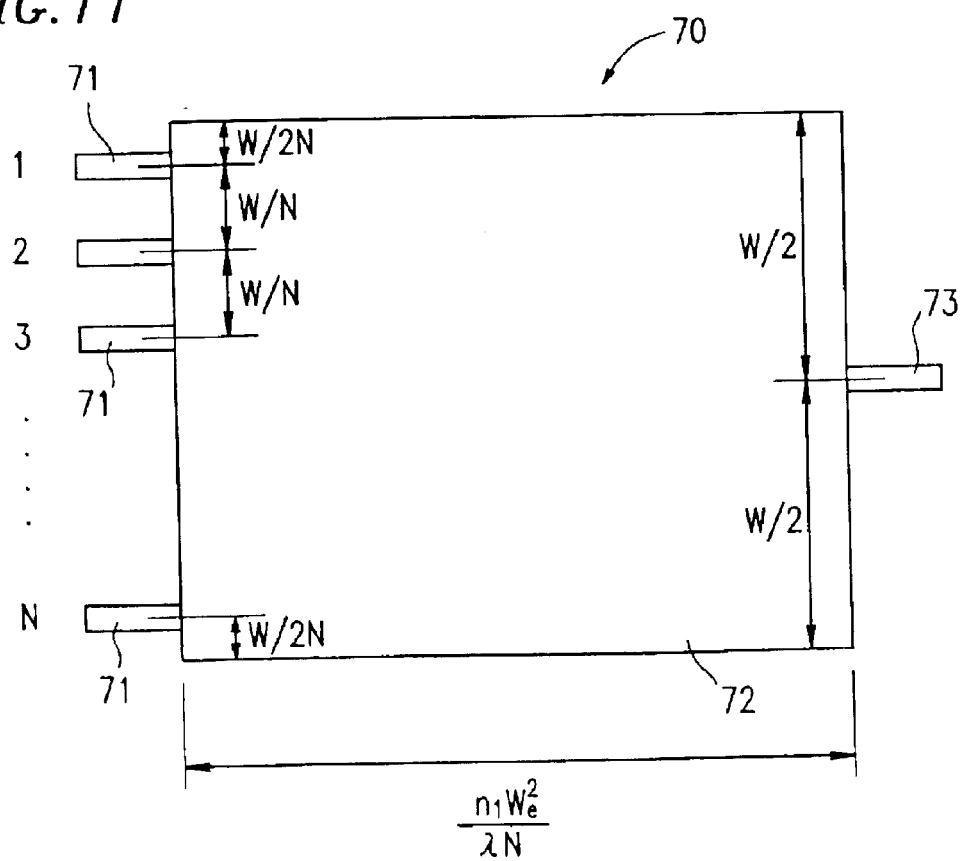

SEMICONDUCTOR LASER ELEMENT AND ELECTRONIC DEVICE USING THE SAME

BACKGROUND OF THE INVENTION

1. Field of the Invention

The present invention relates to a high-power and high speed modulation semiconductor laser element used as a transmission light source for wireless optical communication, and to an electronic device using the same.

2. Description of the Related Art

For a semiconductor laser element used as a transmission light source for wireless optical communication, a high-power laser element which enables high speed modulation and produces a perfectly circular, uniform radiation pattern is desirable. However, in a commonly-employed semiconductor laser element, when the output level of the laser light becomes high, an emission face is dissolved. (This phenomenon is referred to as "catastrophic optical damage (COD)".) COD occurs as described below.

In the vicinity of the emission face, there is a surface level which does not contribute to the light emission. Because of this, when a current is injected into this surface level, carriers are converted to thermal energy without being consumed for light emission, and therefore, the temperature increases on the emission face. Such an increase in temperature further reduces the bandgap, such that light is absorbed by the emission face and the temperature increase is further accelerated. Thus, as the temperature increases in this positive-feedback fashion, COD occurs, i.e., the emission face of the laser light is dissolved.

For the purpose of preventing the occurrence of COD, in general, the density of light is decreased in the vicinity of the emission face, or the emission face and the vicinity thereof are made transparent to the emission wavelength so that the absorption of light is suppressed.

"Applied Physics Letters", vol. 60, no. 6, pp. 668–670 (J. L. Mawst, et al) proposes a phase-locked array semiconductor laser element 50 as shown in FIG. 12. In this phase-locked array semiconductor laser element 50, a first lower cladding layer 52 and an active layer 53 are sequentially provided on a semiconductor substrate 51. On the active layer 53, a plurality of ridge portions 54 are provided with appropriate spaces therebetween. In each ridge portion 54, a second lower cladding layer 54a, a wave-guiding layer 54b, and a second upper cladding layer 54c are sequentially provided. In addition, on the active layer 53, a first upper cladding layer 55 is provided so as to cover the ridge portions 54.

The refractive index n2 of the active layer 53 is greater than the refractive index n1 of the first lower cladding layer 52, and is smaller than the refractive index n3 of the first upper cladding layer 55 (i.e., n1<n2<n3). The refractive index n5 of the wave-guiding layer 54b in each ridge portion 54 is greater than the refractive index n2 of the active layer 53, and is greater than the refractive index n4 of the second lower cladding layer 54a and smaller than the refractive index n6 of the second upper cladding layer 540 (i.e., n2<n5, n4<n5<n6).

In the phase-locked array semiconductor laser element 50 having such a structure, at each ridge portion 54, light generated in the active layer 53 is confined in and guided by the wave-guiding layer 54b. In areas between the ridge portions 54, light generated in the active layer 53 is confined in the active layer 53 itself and travels therethrough. According to such a structure, when all of the phases of guided laser light are synchronized, the oscillation threshold current is a minimum, and the phase-locked array semiconductor laser element 50 emits light.

Furthermore, a window structure semiconductor laser element as shown in FIG. 13 has also been proposed. In this window structure semiconductor laser element 60, a lower cladding layer 62, an active layer 63, an upper cladding layer 64, and a cap layer 65 are sequentially provided on a substrate 61. In this structure, in the vicinity of an end face from which laser light is to be emitted, a portion of the lower cladding layer 62, the active layer 63, and the upper cladding layer 64 are removed, and a p-block layer 66 and an n-block layer 67 are sequentially provided in place thereof. Both the block layers 66 and 67 are made of a transparent material which does not absorb light.

In the window structure semiconductor laser element 60 having such a structure, light is not absorbed by the end faces from which light is emitted. Thus, the occurrence of COD is prevented, and a high power laser emission is realized.

Furthermore, a broad area semiconductor laser element whose current confinement width is expanded for decreasing the entire density of light has been proposed.

Japanese Laid-Open Publication No. 11-68242 discloses a semiconductor laser element in which single mode waveguide areas are provided at both sides of a multimode waveguide area.

In the phase-locked array semiconductor laser element 50 shown in FIG. 12, a laser emission portion is structured in an array pattern. Because of such a structure, a resulting emission pattern is asymmetrical both in the vertical and horizontal directions, and therefore, the transmission area of the laser light is an elliptical shape. This laser element is not suitable for use as an optical transmitter attached to a ceiling, for example. Furthermore, it is necessary to synchronize the phases of the laser light between the active layer 53 and the wave-guiding layer 54b. Such a laser element is difficult to fabricate, and the production yield therefore decreases.

In the window structure semiconductor laser element 60 shown in FIG. 13, the occurrence of COD is prevented, whereby high power laser emission is realized. However, the injection of a large current into the active layer 63 may cause crystal defects, and may impede long-term, stable operation.

In the above-described broad area semiconductor laser element, an area in which a current is injected is relatively large. Therefore, the electrostatic capacitance of an entire laser element increases, and as a result, high speed modulation is not readily performed. Furthermore, the oscillation mode of this element is multimode, and the emission pattern is an elliptical shape is as in the phase-locked array semiconductor laser element. Such an element is not suitable for use as a light source for wireless transmission, for example.

Furthermore, the entirety of the semiconductor laser element disclosed in Japanese Laid-Open Publication No. 11-68242 is utilized as an active region. In such a laser element, COD occurs on the emission surface, and the output level is accordingly low. Furthermore, since the area in which the current is injected is large, the electrostatic capacitance is large. As a result, high speed modulation cannot be readily achieved.

SUMMARY OF THE INVENTION

According to one aspect of the present invention, a semiconductor laser element includes: a semiconductor laser region in which at least one laser emission portion including an active layer for emitting light is provided; a multimode interference region including a first wave-guiding layer, one end of the first wave-guiding layer being optically coupled to the active layer of the at least one laser emission portion; and an output waveguide region including a second wave-guiding layer, the second wave-guiding layer being optically coupled to another end of the first wave-guiding layer, wherein the active layer of the at least one laser emission portion, the first wave-guiding layer, and the second wave-guiding layer are integrally formed.

In one embodiment of the present invention, the semiconductor laser region includes a plurality of laser emission portions arranged in a predetermined array.

In another embodiment of the present invention, the semiconductor laser region, the multimode interference region, and the output waveguide region are provided on the same semiconductor substrate.

In still another embodiment of the present invention, the semiconductor laser element further includes: a first electrode provided on a lower surface of the semiconductor substrate; and a second electrode provided at least on a upper surface of the semiconductor laser region.

In still another embodiment of the present invention, the semiconductor laser element further includes a third electrode provided over at least one of the output waveguide region and at least a portion of the multimode interference region.

In still another embodiment of the present invention, a bias voltage is applied to the third electrode.

In still another embodiment of the present invention, the second electrode extends to at least a portion of an upper surface of the multimode interference region.

In still another embodiment of the present invention, the semiconductor laser element further includes: a first electrode provided on a lower surface of the semiconductor substrate; and a fourth electrode provided at least on a upper surface of the multimode interference region.

In still another embodiment of the present invention, the active layer of the at least one laser emission portion, the first wave-guiding layer, and the second wave-guiding layer are integrally formed of the same material.

In still another embodiment of the present invention, the semiconductor laser region includes a plurality of laser emission portions; and a plurality of third wave-guiding layers for optically coupling a plurality of active layers of the plurality of laser emission portions and the first wave-guiding layer are provided between the plurality of active layers and the first wave-guiding layer.

In still another embodiment of the present invention, the plurality of active layers, the first wave-guiding layer, and the plurality of the third wave-guiding layers are integrally formed of the same material.

In still another embodiment of the present invention, the first wave-guiding layer and the plurality of third wave-guiding layers are formed of a low absorption material.

In still another embodiment of the present invention, the first wave-guiding layer and the plurality of third wave-guiding layers are formed of AlGaAs.

In still another embodiment of the present invention,

According to another aspect of the present invention, an electronic device includes the semiconductor laser element of claim 1, wherein the electronic device supplies a modulation signal to the semiconductor laser element.

According to still another aspect of the present invention, a semiconductor laser element includes: a semiconductor laser region including at least one laser oscillation portion having an active layer which performs laser oscillation; and a multimode Interference region including a first wave-guiding layer, one end of the first wave-guiding layer being optically coupled to the active layer in the at least one laser oscillation portion, wherein the active layer In the at least one laser oscillation portion, and the first wave-guiding layer, are integrally formed.

In one embodiment of the present invention, the semiconductor laser region includes a plurality of laser oscillation portions arranged in a predetermined array.

In another embodiment of the present invention, the semiconductor laser region, and the multimode interference region are provided on the same semiconductor substrate.

In still another embodiment of the present invention, an output waveguide, from which laser light is emitted, is formed integrally with the multimode interference region.

In still another embodiment of the present invention, the semiconductor laser region includes a plurality of laser oscillation portions; and the semiconductor laser element further includes a plurality of input waveguides which have a plurality of second wave-guiding layers for optically coupling a plurality of active layers of the plurality of laser oscillation portions and the first wave-guiding layer provided between the plurality of active layers and the first wave-guiding layer.

In still another embodiment of the present invention, a dielectric film is provided between the plurality of active layers and the plurality of second wave-guiding layers; and the plurality of active layers and the plurality of second wave-guiding layers are optically coupled to each other through the dielectric film.

In still another embodiment of the present invention, the first wave-guiding layer and the plurality of second wave-guiding layers are made of the same material having a low light absorption.

In still another embodiment of the present invention, the first wave-guiding layer and the plurality of second wave-guiding layers are made of AlGaAs.

In still another embodiment of the present invention, each of the plurality of second wave-guiding layers has a predetermined equivalent refractive index.

In still another embodiment of the present invention, each of the plurality of second wave-guiding layers has a predetermined width.

In still another embodiment of the present invention, a manufacturing error in the width of each of the plurality of second wave-guiding layers with respect to the predetermined width is 0.05 $\mu$m or smaller.

In still another embodiment of the present invention, the geometric pattern of the plurality of second wave-guiding layers is made by a reduction exposure method.

According to still another aspect of the present invention, an electronic device includes the semiconductor laser element of claim 15, which outputs a modulated signal to the semiconductor laser element.

The semiconductor laser element of the present invention includes a semiconductor laser region which has an active layer and has at least one waveguiding structure, a multimode interference region which is optically coupled to the semiconductor laser region, and an output waveguiding region which is optically coupled to the multimode interference region. These regions integrally form a resonator structure. Furthermore, an electrode for current injection is provided in at least a portion within a surface area except for an area in the vicinity of an emission face of the output waveguide, and the waveguiding region, which includes the electrode for current injection, is used as an effective active region. The semiconductor laser element of the present invention is characterized by such a structure.

Thus, the invention described herein makes possible the advantages of (1) providing a single mode oscillation laser element which operates stably at a high power for a long period and produces an almost perfectly circular emission pattern, (2) providing a high-power single mode oscillation laser element which can perform high speed modulation, and (3) providing an electronic device using one of these oscillation laser elements.

These and other advantages of the present invention will become apparent to those skilled in the art upon reading and understanding the following detailed description with reference to the accompanying figures.

BRIEF DESCRIPTION OF THE DRAWINGS

FIG. 10A shows a personal computer using a semiconductor laser element according to the present invention.

FIG. 10B schematically shows a structure of a transmission device incorporated in a personal computer, which uses a semiconductor laser element according to the present invention.

FIG. 11 shows a schematic structure of an MMI light combining device.

DESCRIPTION OF THE PREFERRED EMBODIMENTS

Hereinafter, embodiments of the present invention will be described with reference to the drawings.

(Embodiment 1)

Figure 1:
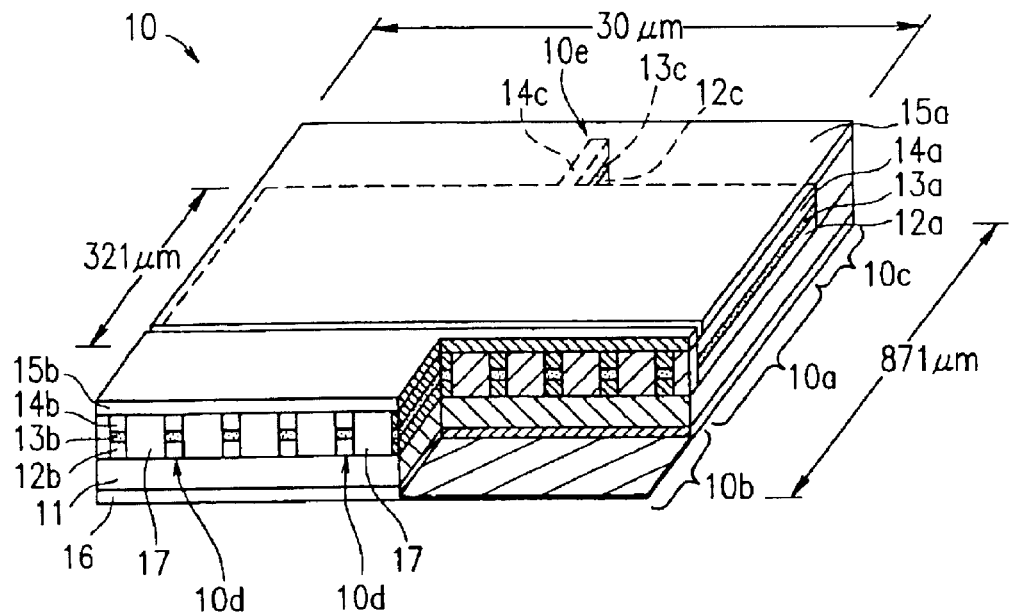
FIG. 1 is a partially cut away, perspective view showing a semiconductor laser element according to embodiment 1 of the present invention.

FIG. 1 is a perspective view showing a semiconductor laser device 10 according to embodiment 1 of the present invention. The semiconductor laser device 10 includes a semiconductor substrate 11 made of n-type GaAs. The semiconductor substrate 11 has a rectangular surface in which the longitudinal length is 871 $\mu$m, and the width is 30 $\mu$m. (Hereinafter, the longitudinal direction of the semiconductor substrate 11 and the direction of the width of the semiconductor substrate 11 are simply referred to as "longitudinal direction" and "width direction", respectively.) FIG. 1 is exaggerated so that the longitudinal length of the semiconductor substrate 11 is schematically shorter than the width thereof. The entire lower surface of the semiconductor substrate 11 is covered with a negative electrode 16.

In a central region of the semiconductor substrate 11, a multimode interference (MMI) region 10a of 321 $\mu$m along the longitudinal direction is provided. On one side of the MMI region 10a with respect to the longitudinal direction is a semiconductor laser region 10b, while on the other side there is an output waveguiding region 10c.

In the MMI region 10a on the central portion of the semiconductor substrate 11, a lower cladding layer 12a of $In_{0.3}Ga_{0.7}As_{0.39}P_{0.61}$ having a thickness of 1.5 $\mu$m is provided on the semiconductor substrate 11 through a buffer layer of GaAs (thickness: 0.5 $\mu$m, not shown). On the lower cladding layer 12a are a waveguiding layer 13a of $In_{0.25}Ga_{0.75}As_{0.49}P_{0.51}$ (thickness: 0.5 $\mu$m) and an upper cladding layer 14a of $In_{0.3}Ga_{0.7}As_{0.39}P_{0.61}$ (thickness: 1.5 $\mu$m).

The output waveguiding region 10c adjacent to the MMI region 10a includes an output waveguide 10e, which extends along the longitudinal direction, at an intermediate position along the width direction of the semiconductor substrate 11. As in the MMI region 10a, the output waveguide 10e includes a lower cladding layer 12c of $In_{0.3}Ga_{0.7}As_{0.39}P_{0.61}$ (thickness: 1.5 $\mu$m) on the semiconductor substrate 11 through a buffer layer of $Al_{0.3}Ga_{0.7}As$ (thickness: 0.5 $\mu$m, not shown). On the lower cladding layer 12a are a waveguiding layer 13c of $In_{0.25}Ga_{0.75}As_{0.49}P_{0.51}$ (thickness: 0.5 $\mu$m) and an upper cladding layer 14c of $In_{0.3}Ga_{0.7}As_{0.39}P_{0.61}$ (thickness: 1.5 $\mu$m).

Over the MMI region 10a, a positive electrode 15a for bias is provided so as to cover the output waveguiding region 10c.

The semiconductor laser region 10b, which is on the other side of the output waveguiding region 10c and adjacent to the MMI region 10a, includes ten laser emission portions 10d equally spaced in the width direction and extending along the longitudinal direction. As in the MMI region 10a, each laser emission portion 10d includes a lower cladding layer 12b of $In_{0.3}Ga_{0.7}As_{0.39}P_{0.61}$ (thickness: 1.5 $\mu$m) on the semiconductor substrate 11 through a buffer layer of GaAs (thickness: 0.5 $\mu$m, not shown). On the lower cladding layer 12b are an active layer 13b of $In_{0.25}Ga_{0.75}As_{0.49}P_{0.51}$ (thickness: 0.5 $\mu$m) and an upper cladding layer 14b of $In_{0.3}Ga_{0.7}As_{0.39}P_{0.61}$ (thickness: 1.5 $\mu$m).

The dimension of each laser emission portion 10d in the width direction is 1 $\mu$m. The ten laser emission portions 10d are positioned symmetrically with respect to a center line along the longitudinal direction which halves the MMI region 10a. Furthermore, the laser emission portions 10d are provided at intervals of about 3 $\mu$m.

In the semiconductor laser region 10b, between the laser emission portions 10d on the upper surface of the semiconductor substrate 11 are buried dielectrics 17 made of $SiO_2$ films. Over the entire upper surfaces of the laser emission portions 10d and the buried dielectrics 17, a positive electrode 15b for modulation is provided so as to be appropriately spaced away from the bias positive electrode 15a in the MMI region 10a.

Figure 2:
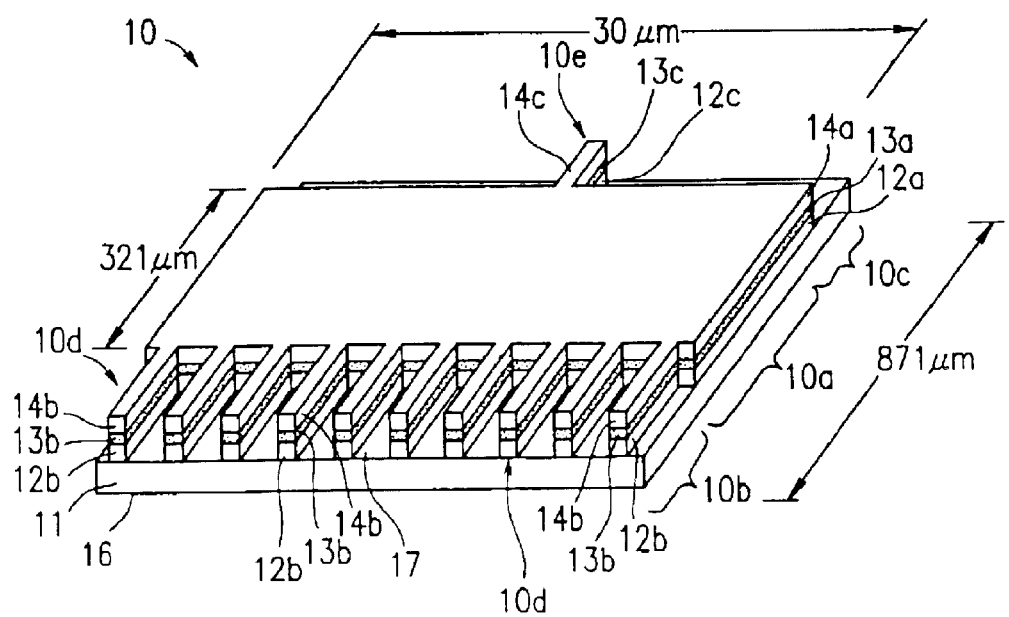
FIG. 2 is a perspective view showing an incomplete semiconductor laser element halfway through the fabrication process according to embodiment 1 of the present invention.

The semiconductor laser element 10 having such a structure is fabricated as described below. On an n-type GaAs semiconductor substrate 11, first, a GaAs buffer layer having a thickness of 0.5 μm (not shown), an n-type $In_{0.3}Ga_{0.7}As_{0.39}P_{0.61}$ lower cladding layer (12a, 12b, and 12c) having a thickness of 1.5 μm, an $In_{0.25}Ga_{0.75}As_{0.49}P_{0.51}$ layer having a thickness of 0.5 μm (to be an active layer 13b and wave guiding layers 13a and 13c), and a p-type $In_{0.3}Ga_{0.7}As_{0.39}P_{0.61}$ upper cladding layer having a thickness of 1.5 μm (14a, 14b, and 14c) are sequentially deposited by metal organic chemical vapor deposition (MOCVD). Then, by the commonly-employed mask process and dry-etching technique, an MMI region 10a is formed integrally with ten laser emission portions 10d and an output waveguide 10e as shown in FIG. 2.

Thereafter, $SiO_2$ films are formed by sputtering or by the CVD method so as to fill the spaces formed by etching, thereby forming buried dielectrics 17 of $SiO_2$ between the laser emission portions 10d and at both ends of the aligned laser emission portions 10d. Then, positive electrodes 15a and 15b and a negative electrode 16 are formed at the positions described above. The negative electrode 16 may be previously provided on the lower surface of the semiconductor substrate 11 before the layered structure is formed on the upper surface thereof.

In the semiconductor laser element 10 having such a structure, a modulation voltage is applied between the negative electrode 16 on the lower surface of the semiconductor substrate 11 and the positive electrode 15b for providing modulation in the semiconductor laser region 10b, while an appropriate bias voltage (DC voltage) is applied to the positive electrode 15a for providing bias in the MMI region 10a and the output waveguiding region 10c. Herein, the voltage applied to the positive electrode 15a in the MMI region 10a does not affect the modulation characteristic in each laser emission portion 10d because the positive electrode 15a for bias and the positive electrode 15b for modulation are separated from each other.

As described above, a current is injected from the positive electrode 15b for modulation to each of the laser emission portions 10d arranged in an array as shown, whereby light is generated in the active layer 13b in each laser emission portion 10d.

The light generated in each laser emission portion 10d travels through the active layer 13b in each laser emission portion 10d and enters the wave guiding layer 13a in the MMI region 10a. Since the active layers 13b in the laser emission portions 10d and the wave guiding layer 13a in the MMI region 10a are formed integrally of the same semiconductor material, the active layers 13b and the wave guiding layer 13a function as a resonator, and the light generated in respective active layers 13b are optically combined in the wave guiding layer 13a in the MMI region 10a. Then, the combined light is a single mode laser light at the end of the wave guiding layer 13a in the MMI region 10a (far side in the drawing). The laser light is output through the wave guiding layer 13a of the output waveguide 10e in the output waveguiding region 10c.

In this case, an appropriate bias voltage is applied to the positive electrode 15a provided in the MMI region 10a and the output waveguiding region 10c, whereby light generated in the active layer 13b of each laser emission portion 10d is output from the output waveguide 10e without being absorbed by the wave guiding layer 13a in the MMI region 10a.

The laser light output from the output waveguide 10e exhibits a unimodal emission pattern because the output waveguide 10e is in a single mode. In addition, the emission pattern is substantially a perfect circle. Furthermore, since the current density of the bias voltage applied through the positive electrode 15a in the output waveguide 10e is low, non-emission coupling of the surface level is small, and thus, the temperature increase is suppressed. As a result, the threshold output level for the occurrence of COD increases.

As described above, in each laser emission portion 10d having a width of 1 μm in the semiconductor laser region 10b, a current is injected in each active layer 13b thereof which functions as a current injection layer, whereby light is provided from each active layer 13b. Each laser emission portion 10d is a buried hetero structure laser (BH laser) in which a current is confined therein by $SiO_2$ film buried dielectrics 17 provided at both sides thereof. Furthermore, the parasitic capacitance of the semiconductor is small because the width of each active layer 13b is as small as about 1 μm, and therefore, the electrostatic capacitance in the semiconductor laser region 10b is small.

Figure 3:
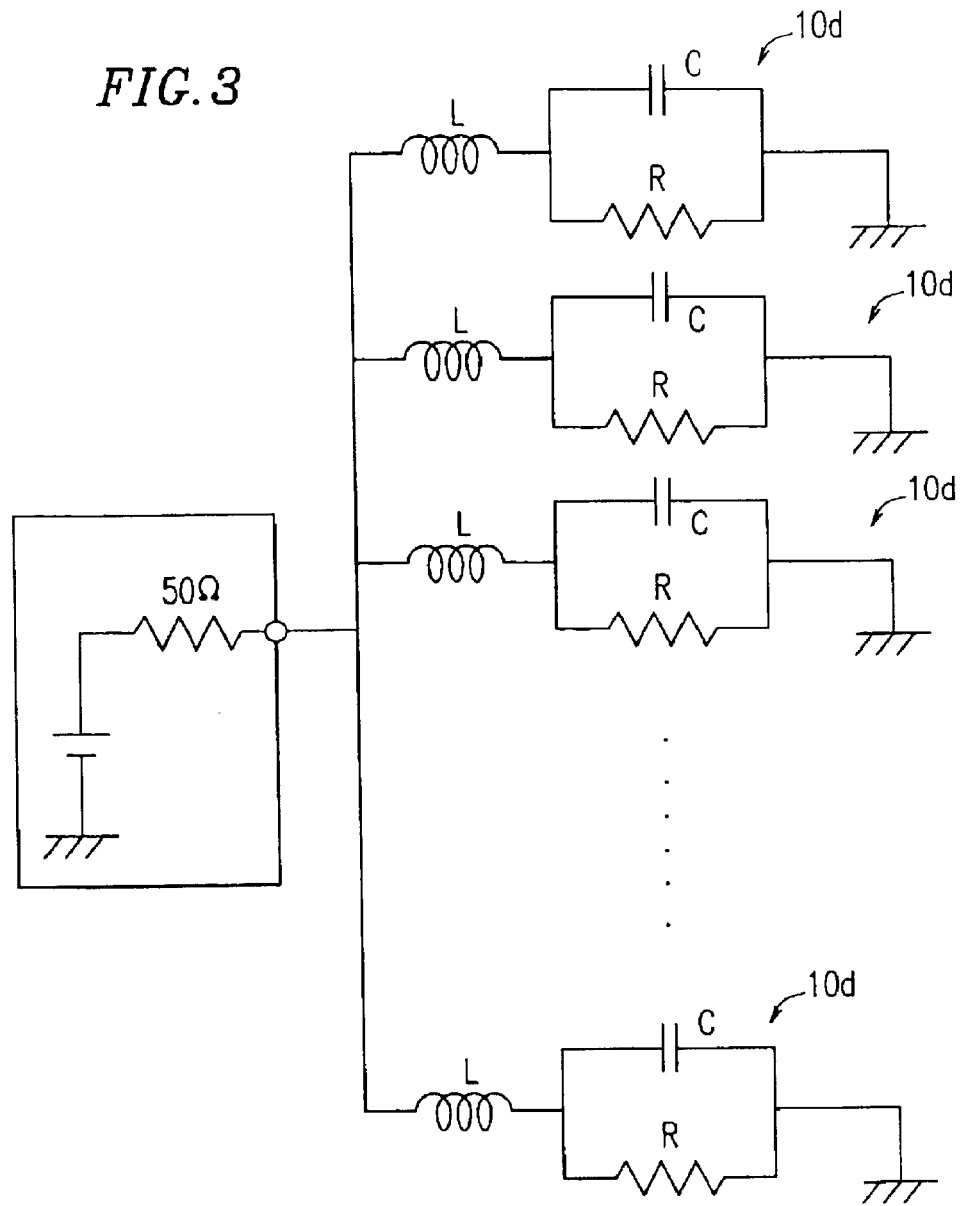
FIG. 3 shows an equivalent circuit of the semiconductor laser element according to embodiment 1 of the present invention.

In the semiconductor laser element 10 having such a structure, the laser emission portions 10d, which are BH lasers, are connected in parallel between the negative electrode 16 and the positive electrode 15b for modulation. That is, the semiconductor laser element 10 is equivalent to an electric circuit as shown in FIG. 3, in which each laser emission portion 10d is represented by an inductance L, a capacitance C, and a resistance R. In this case, a frequency transfer function A of each laser emission portion 10d is determined by evaluating the voltage at the resistance R of the laser emission portion 10d. The relationship between the current I and the input voltage V at the resistance R in each laser emission portion 10d is represented by expression (1):

$$I = V/Z(\omega) \tag{1}$$

In this case, when the input resistance is 50Ω, Z(ω) is represented by expression (2):

$$Z(\omega) = (50N + j\omega L)(1 + j\omega RC) + R \tag{2}$$

where ω represents an angular frequency, which is represented by an expression ω=2πf, where f is a frequency, and j is an imaginary number.

The frequency transfer function A(f) is represented by expression (3):

$$A(f) = |Z(0)/Z(2\pi f)| \tag{3}$$

Sometimes A(f) is called as injection ratio or gain.

Figure 4:
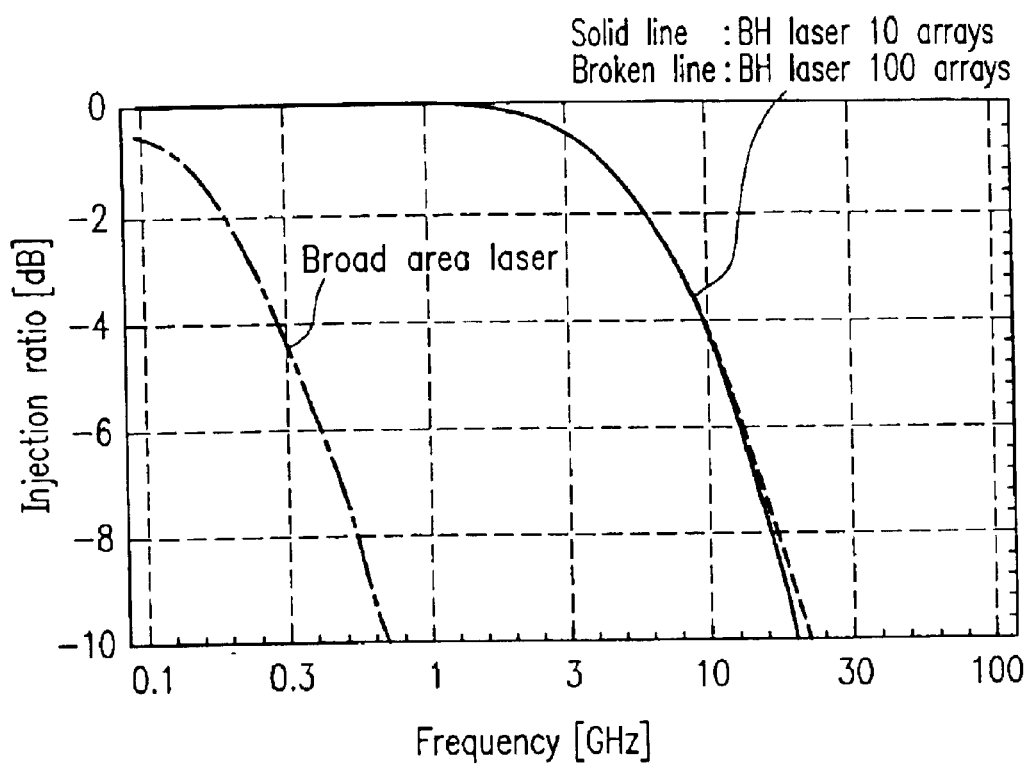
FIG. 4 is a graph illustrating the characteristics of the frequency transfer function of the semiconductor laser element according to embodiment 1 of the present invention.

In the semiconductor laser element 10 according to embodiment 1 which includes ten laser emission portions 10d, for each laser emission portion 10d, the inductance L is 1 nH, the electrostatic capacitance C is 2 pF, and the resistance R is 5.7Ω. The frequency transfer function of the semiconductor laser element 10 is shown by a solid line in FIG. 4. Since the semiconductor laser element 10 has a small electrostatic capacity, a desirable frequency transfer function is obtained extensively in a high frequency range. That is, the semiconductor laser element 10 exhibits a rapid response. The broken line in FIG. 4 shows a frequency transfer function of a semiconductor laser element having substantially the same structure of the semiconductor laser element 10 except for including one hundred laser emission portions 10d. As seen from the graph, the frequency transfer function of the semiconductor laser element including one hundred laser emission portions 10d is substantially the same as that of the semiconductor laser element 10 including ten laser emission portions 10d.

For comparison, a frequency transfer function of a broad area semiconductor laser element (inductance L of 1.3 nH, electrostatic capacitance C of 150 pF, and resistance R of 2.5Ω) is shown by the chain line in FIG. 4. The broad area semiconductor laser element exhibits only about a ¹⁄₁₀ of the response speed of the semiconductor laser element 10 according to embodiment 1 shown in FIG. 1, because the broad area semiconductor laser element has a large electrostatic capacitance C.

Furthermore, as a result of measuring the reliability of the semiconductor laser element 10, the lifetime thereof was nearly 100,000 hours for an output of 300 mW.

As described hereinabove, the semiconductor laser element 10 shown in FIG. 1 simultaneously achieves high power, high reliability, and rapid response.

(Embodiment 2)

Figure 5:
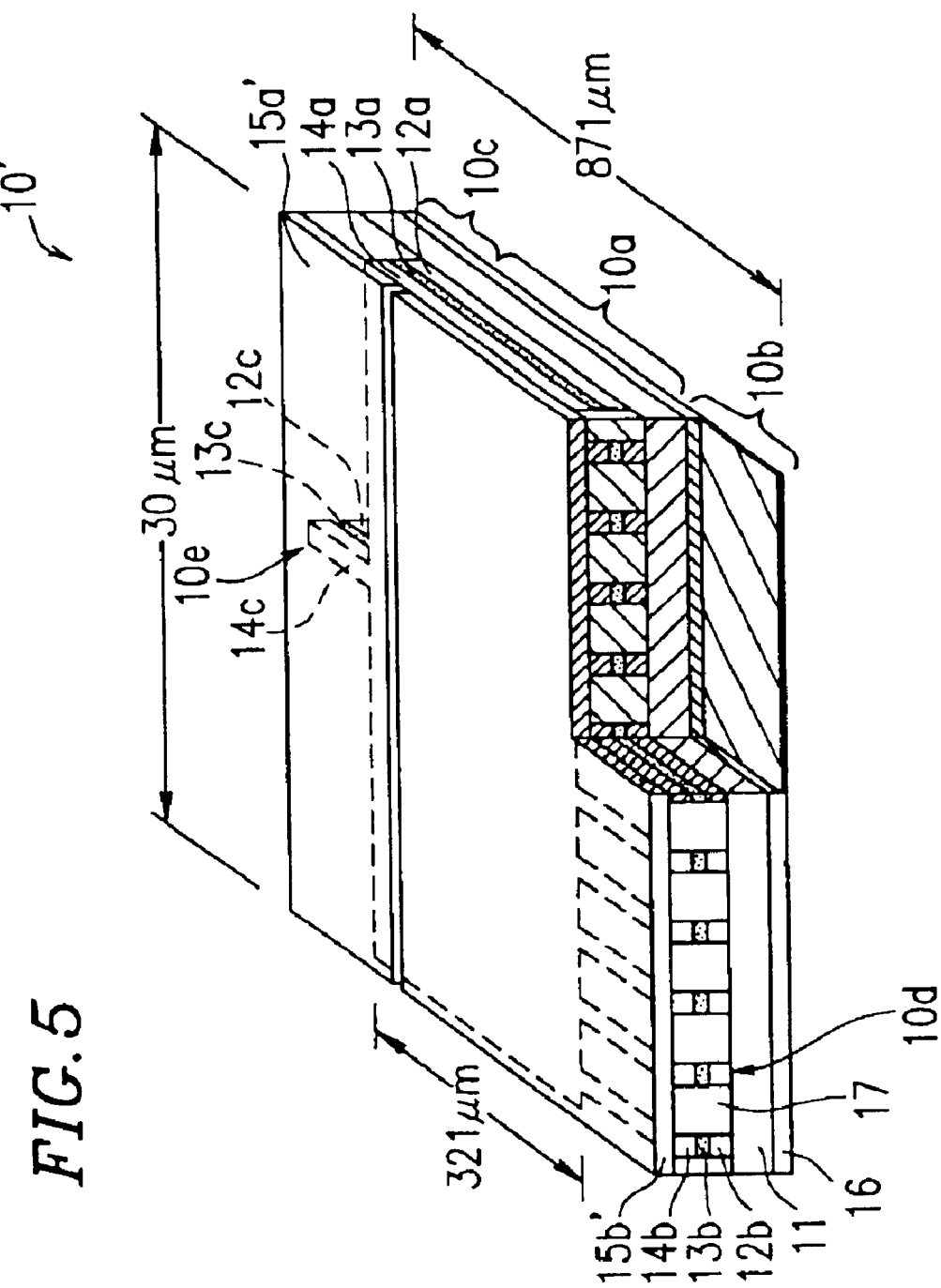
FIG. 5 is a partially cut away, perspective view showing a semiconductor laser element according to embodiment 2 of the present invention.

FIG. 5 is a perspective view showing a semiconductor laser element 10' according to embodiment 2 of the present invention. (It should be noted that in the embodiments of the present invention, like reference numerals denote like elements.) The lengths of a positive electrode 15a' for bias and a positive electrode 15b' for modulation of the semiconductor laser element 10' in a longitudinal direction are different from those of the positive electrode 15a for bias and the positive electrode 15b for modulation of the semiconductor laser element 10.

The fabrication method of the semiconductor laser element 10' will not be described in detail because it is the same as that described for embodiment 1. A semiconductor laser region 10b, an MMI region 10a, and an output waveguide region 10a are integrally formed as shown in FIG. 2. In embodiment 1, as shown in FIG. 1, the positive electrode 15b for modulation (for laser emission) is formed over the semiconductor laser portions 10b, and the positive electrode 15a for bias is formed over the MMI region 10a and the output waveguide region 10c. On the other hand, in embodiment 2 (FIG. 5), the positive electrode 15b' for modulation is formed over the semiconductor laser region 10b and a portion of the MMI region 10a, while the positive electrode 15a' for bias is formed over the output waveguide region 10c and another portion of the MMI region 10a.

The actual operation of the semiconductor laser element 10' is now described. The injection of a current into the positive electrode 15b' for modulation generates light in the active layers 13b and in regions under the positive electrode 15b' for modulation. When a gain exceeds an entire loss in a waveguide region consisting of regions 10b, 10a, and 10a which works as a resonator, the generated light is converted to a laser oscillation. The positive electrode 15a' for bias is formed over a region in which the positive electrode 15b' for modulation is not provided. In such a structure, a current flow in a region in which the positive electrode 15a' for bias is formed suppresses the absorption of light.

In the case where the positive electrode 15b' having such a structure is employed, an area of the emission region of a laser element is significantly large as compared to a conventional laser element. Therefore, it is natural that the gain of the entire laser element improves, and in addition, the oscillation threshold current decreases, whereby the emission efficiency improves. Moreover, the saturation of gain due to current injection does not occur, and thus, laser light of a higher power can be obtained. As described above, the light generated in the active regions under the positive electrode 15b' for modulation reaches a laser oscillation through a waveguide (as a resonator) consisting of the semiconductor laser element region 10b, the MMI region 10a, and the output waveguide region 10c. Thus, a single mode, high power laser light can be emitted from the output waveguide 10e. The semiconductor laser element 10' produces an oscillation threshold current of −10%, an efficiency of +5%, and a maximum output of +20% as compared to the semiconductor laser element 10 of embodiment 1.

On the other hand, in the semiconductor laser element 10', there is concern about degradation in a modulation characteristic because the area of the emission region is large as compared to the semiconductor laser element 10 of embodiment 1. In the semiconductor laser element 10' of embodiment 2, the modulation frequency is set to 500 MHz with which the frequency transfer function decreases by 3 dB. Thus, a sufficient modulation speed can be obtained in certain applications of the semiconductor laser element 10'.

Even in the semiconductor laser element 10' according to embodiment 2, the single-mode waveguide 10e is a region which does not contribute to the emission of light and, in which COD never occurs. Furthermore, in the formation of the positive electrode 15a' for bias and the positive electrode 15b' for modulation, it is the positioning of masks for forming the electrodes not required to be performed precisely as done in the fabrication of the semiconductor laser element 10. Thus, the formation of the electrodes 15a' and 15b' does not affect the characteristics of the laser element. In an experimentally fabricated laser element according to embodiment 2, even when an interface between the positive electrode 15a' for bias and the positive electrode 15b' for modulation is shifted by about 20 μm, the emission efficiency does not substantially vary, and therefore, the shift of the interface does not affect the production yield.

As described above, in embodiment 1, the high power laser output is achieved by increasing the number of the laser emission portions 10d in the array in the semiconductor laser region 10b. On the other hand, in embodiment 2, the high power laser output is achieved by providing the active region in the MMI region. Therefore, in the semiconductor laser region 10b, a small number of laser emission portions 10d in the array are sufficient, e.g., only one laser emission portions 10d is sufficient for high power laser output. In this case, the window structure of the conventional laser element may be employed for the purpose of preventing the occurrence of COD in the semiconductor laser region 10b.

Furthermore, the positive electrode 15b' for modulation may be provided only over the MMI region 10a in order to improve the semiconductor laser element 10' having the above structure. As the power of the laser increases, concern for the occurrence of COD at a rear end face of the laser element in the semiconductor laser region 10b accordingly grows. However, the occurrence of COD can be prevented by forming the positive electrode 15b' for modulation so as not to be in the vicinity of the interface between the semiconductor laser region 10b and air, but rather only in the MMI region 10a, or in the MMI region 10a and a portion of the semiconductor laser region 10b. When there is concern about the light absorption by a region in which the positive electrode 15b' for modulation is not provided over the semiconductor laser region 10b, it is only necessary to form a bias electrode in this region.

(Embodiment 3)

Figure 6:
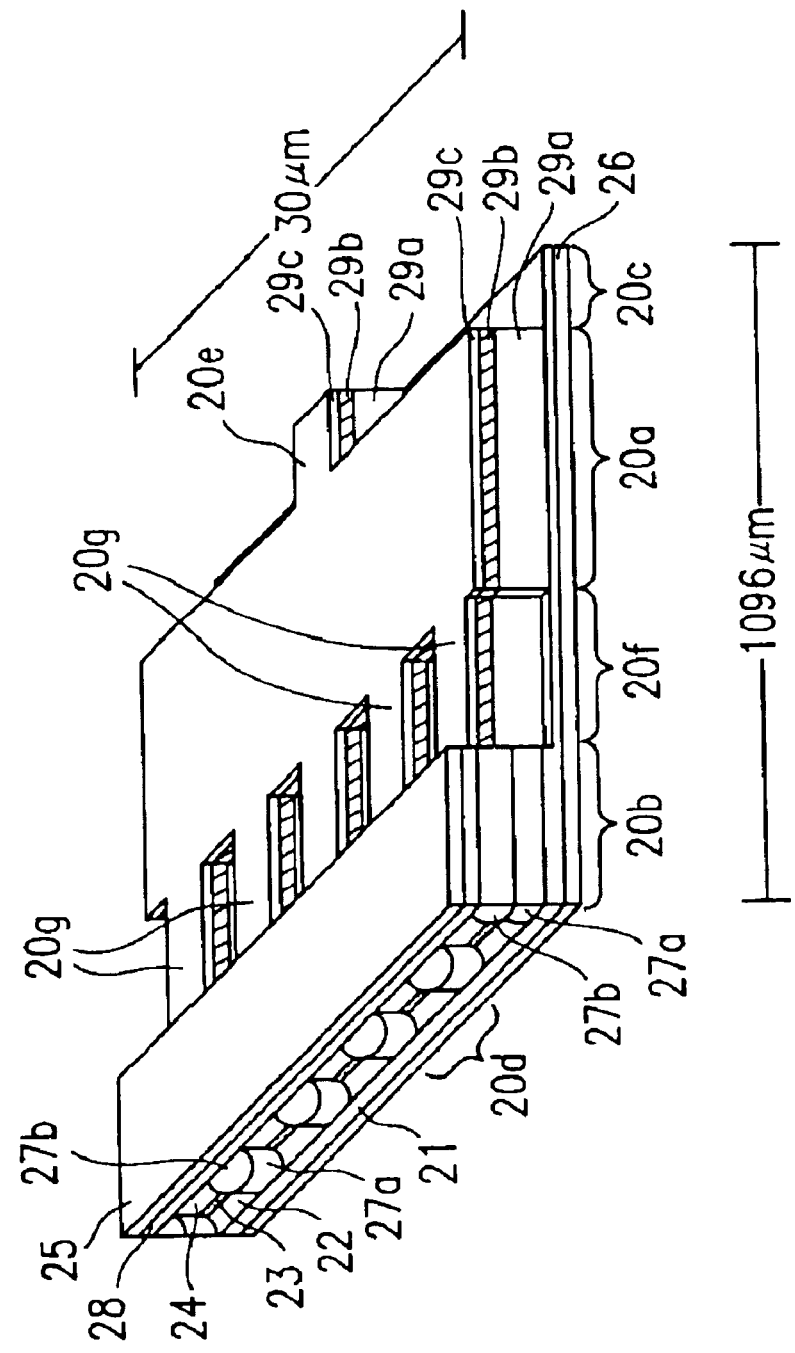
FIG. 6 is a perspective view showing a semiconductor laser element according to embodiment 3 of the present invention.

FIG. 6 is a perspective view showing a semiconductor laser device 20 according to embodiment 3 of the present invention. The semiconductor laser device 20 includes a semiconductor substrate 21 made of n-type GaAs. The semiconductor substrate 21 has a rectangular surface in which the longitudinal length is 1096 µm, and the width is 30 µm. (Hereinafter, the longitudinal direction of the semiconductor substrate 21 and the direction of the width of the semiconductor substrate 21 are simply referred to as "longitudinal direction" and "width direction", respectively.) A negative electrode 26 is provided on the entire lower surface of the semiconductor substrate 21. FIG. 6 is exaggerated so that the longitudinal length of the semiconductor substrate 21 is schematically shorter than the width thereof.

On one side of the semiconductor substrate 21 with respect to the longitudinal direction thereof is a semiconductor laser region 20b (250 µm long in the longitudinal direction). The semiconductor laser region 20b includes a plurality of laser emission portions 20d arranged in a predetermined array (in this example, arranged in a line along the width direction). Adjacent to the semiconductor laser region 20b is an input waveguide region 20f (50 µm in the longitudinal direction) including a plurality of input waveguides 20g formed integrally with the respective laser emission portions 20d. Furthermore, adjacent to an input waveguide region 20f is an MMI region 20a (746 µm long in the longitudinal direction) formed integrally with the respective input waveguides 20g, and adjacent to the MMI region 20a is an output waveguide region 20c (50 µm long in the longitudinal direction).

In the semiconductor laser region 20b on the semiconductor substrate 21, the five laser emission portions 20d, each of which has a dimension of about 1 µm in the width direction, are arranged in a line so as to be equally spaced. Each laser emission portion 20d includes an n-type GaAs buffer layer (thickness: 0.5 µm, not shown) on the substrate 21, and an n-type $Al_{0.2}Ga_{0.8}As$ lower cladding layer 22 (thickness: 1.0 µm) on the buffer layer. On the lower cladding layer 22 are an $Al_{0.08}Ga_{0.92}As$ active layer 23 (thickness: 0.12 µm) and a p-type $Al_{0.2}Ga_{0.8}As$ upper cladding layer 24 (thickness: 1.0 µm). An end face of each laser emission portion 20d is provided with a high reflection film (not shown).

The central laser emission portion 20d among the aligned laser emission portions 20d is positioned so that the longitudinal axis thereof is on a center line of the MMI region 20a along the longitudinal direction.

In the semiconductor laser region 20b, between the laser emission portions 20d and in both sides of the semiconductor laser region 20b, p-$Al_{0.3}Ga_{0.7}As$ lower block layers 27a (thickness: about 1 µm) and n-$Al_{0.3}Ga_{0.7}As$ upper block layers 27b are sequentially provided.

Furthermore, in the MMI region 20a, an $Al_{0.25}Ga_{0.75}As$ lower guide layer 29a, an $Al_{0.20}Ga_{0.80}As$ wave-guiding layer 29b (thickness: about 0.3 µm), and an $Al_{0.25}Ga_{0.75}As$ upper guide layer 29c (thickness: about 1 µm) are sequentially provided on the semiconductor substrate 21.

In the input waveguide region 20f between the semiconductor laser region 20b and the MMI region 20a, five input waveguides 20g which connect the five laser emission portions 20d and the MMI region 20a are provided on the semiconductor substrate 21. Each input waveguide 20g includes the same layers as those included in the MMI region 20a, i.e., the $Al_{0.25}Ga_{0.75}As$ lower guide layer 29a, the $Al_{0.20}Ga_{0.80}As$ wave-guiding layer 29b (thickness: about 0.3 µm), and the $Al_{0.25}Ga_{0.75}As$ upper guide layer 29c (thickness: about 1 µm), which are provided on the semiconductor substrate 21.

In the center of the output waveguide region 20c adjacent to the MMI region 20a, there is an output waveguide 20e which is formed integrally with the input waveguides 20g. The output waveguide 20e includes the same layers as those included in the MMI region 20a, i.e., the $Al_{0.25}Ga_{0.75}As$ lower guide layer 29a, the $Al_{0.20}Ga_{0.80}As$ wave-guiding layer 29b (thickness: about 0.3 µm), and the $Al_{0.25}Ga_{0.75}As$ upper guide layer 29c (thickness: about 1 µm), which are provided on the semiconductor substrate 21. An end face of the output waveguide 20e is provided with a low reflection film (not shown) having a reflectance of about several percentages.

The semiconductor laser element 20 having the above structure is fabricated as described below. Firstly, the structure of the semiconductor laser region 20b is formed on an n-type GaAs substrate 21. Over the entire upper surface of the n-type GaAs substrate 21, an n-type GaAs buffer layer (thickness: 0.5 µm, not shown), an n-type $Al_{0.2}Ga_{0.8}As$ lower cladding layer 22 (thickness: 1.0 µm), an $Al_{0.08}Ga_{0.92}As$ active layer 23 (thickness: 0.12 µm), and a p-type $Al_{0.2}Ga_{0.8}As$ upper cladding layer 24 (thickness: 1.0 µm) are sequentially formed. Then, an $SiO_2$ mask is formed by sputtering over the upper surface of the upper cladding layer 24, and a plurality of resist stripes each having a width of 2 µm are formed on the $SiO_2$ mask with 6 µm spaces therebetween.

Next, a resist mask is transferred onto the $SiO_2$ mask by reactive ion etching (RIE) with a $CF_4$ gas. Then, the resist is removed by ashing, and the etching is performed with an etchant including citric acid. In this step, the etching which is performed for a predetermined period causes side etching at an intermediate position of the etching depth, so that the active layer 23 in the layered structure is narrowed to about 1 µm in the width direction.

Figure 7A:
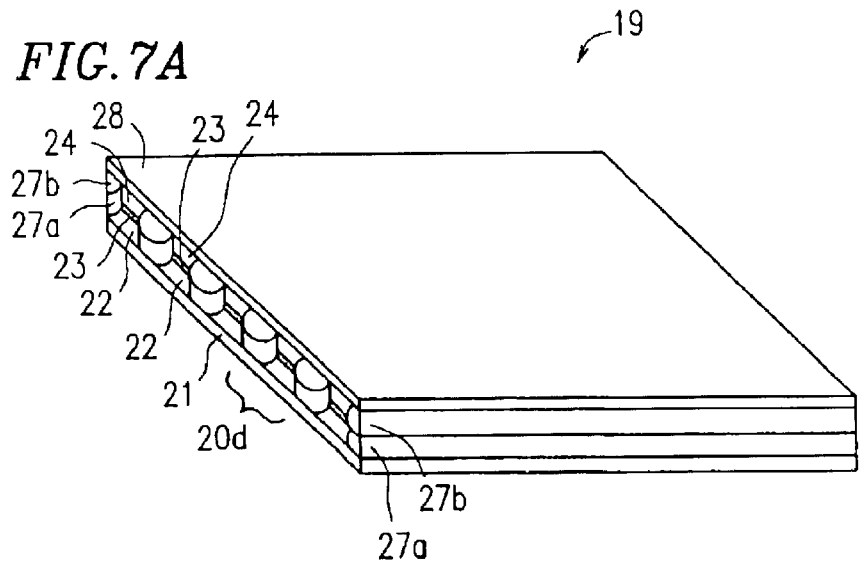
FIGS. 7A and 7B each show a step in a process of fabricating a semiconductor laser element according to the present invention.

In the resultant structure, p-$Al_{0.3}Ga_{0.7}As$ lower block layers 27a (thickness: about 1 µm) and n-$Al_{0.3}Ga_{0.7}As$ upper block layers 27b (thickness: about 1 µm), which are provided for current constriction, are sequentially formed so as to fill the grooves made by etching. This step is a selective growth step using the $SiO_2$ film, in which the semiconductor can be selectively grown only in the grooves made by etching because no semiconductor is grown on the $SiO_2$ film which is formed on the upper cladding layer 24. Thereafter, the $SiO_2$ film is removed by a hydrofluoric acid etchant, and a p-GaAs cap layer 28 is formed over the resultant structure by a MOCVD method, thereby obtaining the fabricated semiconductor layered structure 19 as shown in FIG. 7A.

Thereafter, in a similar fashion to the above-described formation of the $SiO_2$ mask, the $SiO_2$ mask is formed so as to cover the semiconductor laser region 20b. Then, in the input waveguide region 20f, the MMI region 20a, and the output waveguide region 20c, the layered semiconductor structure and portions of the buffer layer and the semiconductor substrate 21 are etched away by a sulfuric acid etchant.

Next, on the semiconductor substrate 21 except for the semiconductor laser region 20b, an $Al_{0.25}Ga_{0.75}As$ lower guide layer 29a, an $Al_{0.20}Ga_{0.80}As$ wave-guiding layer 29b (thickness: about 0.3 µm), and an $Al_{0.25}Ga_{0.75}As$ upper guide layer 29c (thickness: about 1 µm) are sequentially formed. The thickness of the lower guide layer 29a varies in accordance with the depth of the etching performed to the buffer layer, but is adjusted so that the horizontal cross section of the wave-guiding layer 29b which halves the wave-guiding layer 29b and the horizontal cross section of the active layer 23 in each laser emission portion 20d in the semiconductor laser region 20b which halves the active layer 23 are on the same plane.

The lower guide layer 29a, the wave-guiding layer 29b, and the upper guide layer 29c (semiconductor crystal layers)

are selectively grown using the $SiO_2$ film, thereby forming a desirable layered structure in which the semiconductor crystals are not grown on the $SiO_2$ film.

Figure 7B:
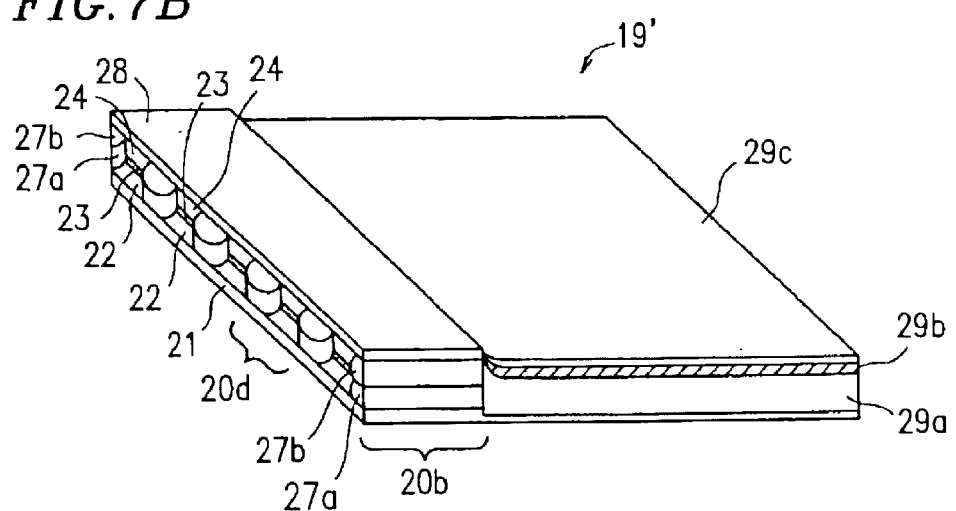

After the lower guide layer 29a, the wave-guiding layer 29b, and the upper guide layer 29c have been formed, in the interface area between the newly-fabricated layered structure and the previously-fabricated layered structure in the semiconductor laser region 20b, the thickness of the lower guide layer 29a increases toward the semiconductor laser region 20b as shown in the layered structure 19' of FIG. 7B. As a result, the wave-guiding layer 29b is slightly curved, so that the length in the longitudinal direction is ten and several micrometers. However, since the refractive index of semiconductors is large, light emitted from each laser emission portion 20d and introduced to the wave-guiding layer 29b is rarely diffused. Thus, a sufficient optical connection is made between the active layer 23 in the semiconductor laser region 20b and the wave-guiding layer 29b in the input waveguide region 20f (FIG. 6).

Thereafter, in the input waveguide region 20f, the MMI region 20a, and the output waveguide region 20c, an $SiO_2$ mask having predetermined patterns of the five input waveguides 20g in the input waveguide region 20f, the MMI region 20a, and the single output waveguide 20e in the output waveguide region 20c is formed in a similar fashion to the above-described formation of the $SiO_2$ mask. Then, predetermined structures are formed by dry etching in the input waveguide region 20f, the MMI region 20a, and the output waveguide region 20c.

Next, the $SiO_2$ mask is removed from the resultant structure, a negative electrode 26 is provided on the entire lower surface of the semiconductor substrate 21, and a positive electrode 25 is provided over the semiconductor laser region 20b. Then, a high reflection film is deposited on an end face of each laser emission portion 20d (i.e., an interface between the laser emission portion 20d and air). As well, a reflection film having a low reflectance of about several percentages is deposited on an end face of the output waveguide 20e in the output waveguide region 20c (i.e., an interface between the output waveguide 20e and air. Thus, the semiconductor laser element 20 as shown in FIG. 6 is completed.

In the semiconductor laser element 20 having the above structure, each laser emission portion 20d in the semiconductor laser region 20b is a BH laser, which is optically connected to a corresponding input waveguide 20g. Furthermore, since the structures in the input waveguide region 20f, the MMI region 20a, and the output waveguide region 20c are formed integrally as described above, the semiconductor laser region 20b, the input waveguide region 20f, the MMI region 20a, and the output waveguide region 20c altogether function as a resonator. This semiconductor laser element 20 emits laser light having a wavelength of 800 nm, for example, from the output waveguide 20e.

The semiconductor laser element 20 emits laser light at a high output rate of 80% with respect to the total optical power of light generated in the laser emission portions 20d in the semiconductor laser region 20b, and produces an ideal emission pattern of the laser light. The 20% optical loss of the laser light results from coupling losses between the laser emission portions 20d of the semiconductor laser region 20b and the input waveguides 20g of the input waveguide region 20f.

According to embodiment 3, the reflection at the interface between each laser emission portion 20d and a corresponding input waveguides 20g is only 0.3%. That is, in the semiconductor laser element 20, all the structures in the semiconductor laser region 20b, the input waveguide region 20f, the MMI region 20a, and the output waveguide region 20c function as a single optical resonator. Thus, light that propagates through such an optical resonator spontaneously meets the phase condition imposed on light that enters the input waveguides 20g.

The frequency response of the semiconductor laser element 20 according to embodiment 3 was measured. The measurement showed that the electrostatic capacity in each laser emission portion 20d was as small as about 10 pF, and when the frequency transfer function of the entire semiconductor laser element 20 decreased by 3 dB, the frequency was about 2 GHz, which is significantly satisfactory.

In the semiconductor laser element 20 according to embodiment 3, since the wave-guiding layer 29b included in the input waveguides 20g, the MMI region 20a, and the output waveguide 20e are made of AlGaAs, which is a low light absorption material (substantially non-optically absorptive), the oscillation threshold current is low. Therefore, the semiconductor laser element 20 can be driven by a small current, and moreover, it is not necessary to apply a voltage to the input waveguide region 20f, the MMI region 20a, and the output waveguide region 20c.

Thus, the semiconductor laser element 20 according to embodiment 3 produces a high power laser light, and realizes a high speed modulation. Furthermore, the optical emission pattern is almost perfectly circular. In addition, the semiconductor laser element 20 can operate at 200 mW for about 100,000 hours, and offers high reliability.

The length of the MMI region 20a of the semiconductor laser element 20 is determined based on the numerical expression described in "Journal of Lightwave Technology" Vol. 13, 1995, no. 4, pp. 615–627 (Lucas B. Soldano, et al.). For example, in an MMI device 70 as shown in FIG. 11, light entering from N input waveguides 71 into an MMI region 72 causes interference in the MMI region 72, and is emitted from an output waveguide 73 as a single mode laser light. The optimum length of the MMI region 72 is represented by $n_1 \cdot W_e^2 / \lambda \cdot N$, where "$W_e$" is represented by expression (4):

$$W_e = W + \frac{\lambda}{\pi \sqrt{n_1^2 - n_2^2}} \left(\frac{n_2}{n_1}\right)^2 \tag{4}$$

where the width of the MMI region 72 is W, the space between the adjacent input waveguides 71 is W/N, the distance between the input waveguides 71 at either end and at the side faces of the MMI region 72 is W/2N, the refractive index of the MMI region 72 is $n_1$, the refractive index at each side of the MMI region 72 is $n_2$, and the wavelength of a guided wave in a vacuum is $\lambda$.

(Embodiment 4)

Figure 8:
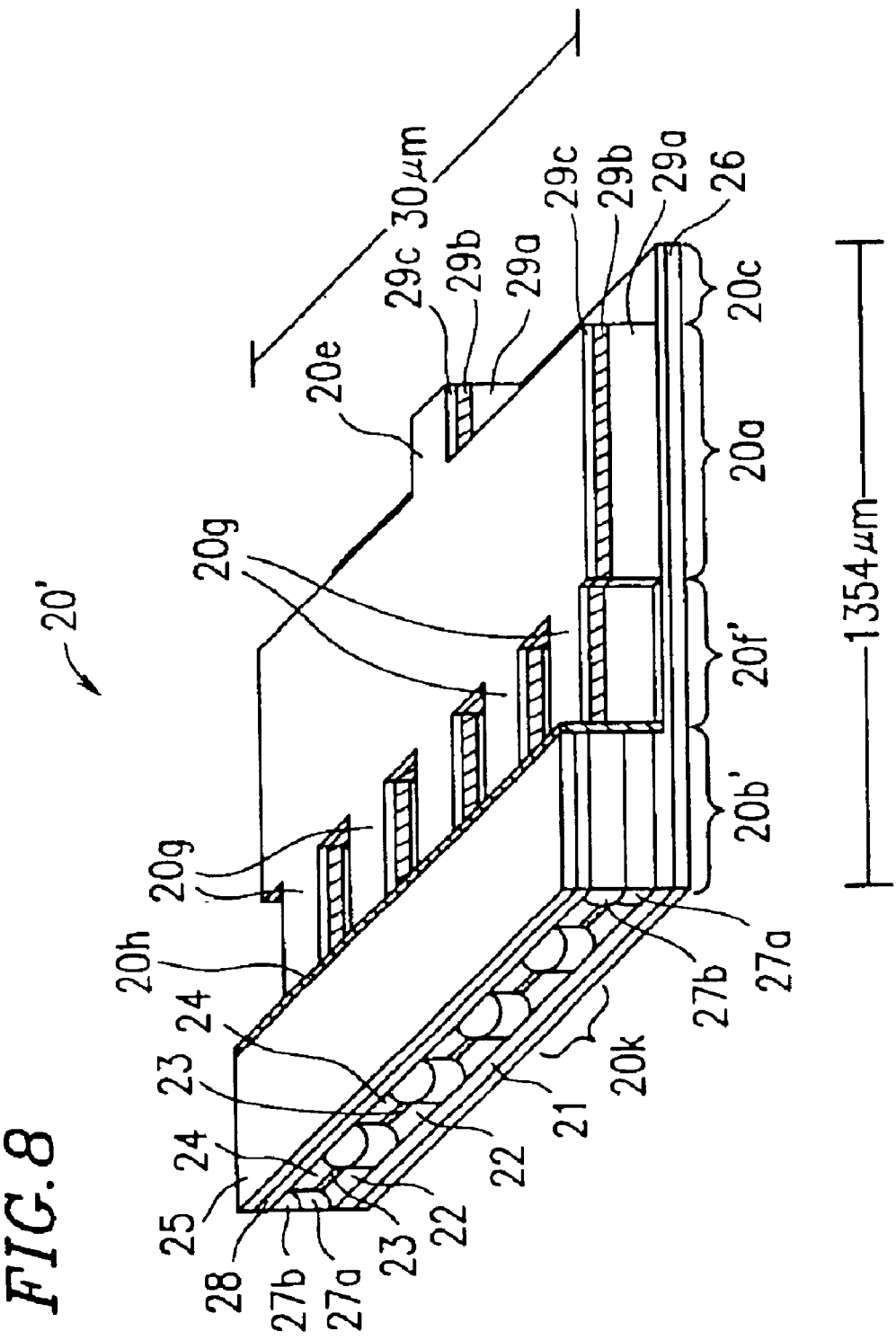
FIG. 8 is a perspective view showing a semiconductor laser element according to embodiment 4 of the present invention.

FIG. 8 is a perspective view showing a semiconductor laser element 20' according to embodiment 4 of the present invention. The semiconductor laser element 20' includes, in addition to the structure of the semiconductor laser element 20 shown in FIG. 6, an $SiO_2$ film 20h on an end face of the structure in the semiconductor laser region 20b' which faces the input waveguide region 20f'. That is, the structure in the semiconductor laser region 20b' and each of the input waveguides 20g in the input waveguide region 20f' are connected through the $SiO_2$ dielectric film 20h. Therefore, the structure in the semiconductor laser region 20b' is a resonator structure having a dielectric film 20h on an end face of each laser oscillation portion 20k. In the semiconductor laser region 20b', the plurality of laser oscillation portions 20k for emitting light generated in an active layer 23 as laser light are arranged in a predetermined array (in this example, arranged in a line).

In the longitudinal direction, the length of the semiconductor laser region 20b' is 250 µm, the length of the input waveguide region 20f' is 308 µm, the length of the MMI region 20a is 746 µm, and the length of the output waveguide region 20c is 50 µm. Accordingly, the total length of the semiconductor laser element 20' in the longitudinal direction is 1354 µm. The width of the semiconductor laser element 20' is 30 µm. The width of each input waveguide 20g is set so that the output power of laser light output from each laser oscillation portion 20k is maximum. For example, each of the input waveguides 20g at both sides of the input waveguide region 20f' has a width of 0.9 µm, each of the input waveguides 20g adjacent to the input waveguides 20g at the both sides of the input waveguide region 20f' has a width of 1.0 µm, and the input waveguide 20g in the center of the input waveguide region 20f' has a width of 1.1 µm. Other details of the structure of the semiconductor laser element 20' are the same as those of the semiconductor laser element 20 shown in FIG. 6.

A method for fabricating the semiconductor laser element 20' having the above structure is now described. In the first instance, a layered structure similar to that shown in FIG. 7A is formed on the semiconductor substrate 21 as in the fabrication of the semiconductor laser element 20 shown in FIG. 6.

Next, an SiO$_2$ mask is formed so as to cover the semiconductor laser region 20b', and etching is performed so that the semiconductor layers and portions of the buffer layer and the semiconductor substrate 21 corresponding to the input waveguide region 20f', the MMI region 20a, and the output waveguide region 20c (FIG. 8) are removed, whereby the structure in the semiconductor laser region 20b' is fabricated.

Thereafter, an SiO$_2$ film 20h is formed by bias sputtering on an end face of the structure in the semiconductor laser region 20b' which has been formed by etching while a bias voltage is being applied to the semiconductor substrate 21. By bias sputtering, the SiO$_2$ film 20h is not formed on the semiconductor substrate 21, but formed only on an upper surface and the end face of the structure in the semiconductor laser region 20b'.

Next, on the semiconductor substrate 21 except for the semiconductor laser region 20b', an Al$_{0.25}$Ga$_{0.75}$As lower guide layer 29a, an Al$_{0.20}$Ga$_{0.80}$As wave-guiding layer 29b (thickness: about 0.3 µm), and an Al$_{0.25}$Ga$_{0.75}$As upper guide layer 29c (thickness: about 1 µm) are sequentially formed. The thickness of the lower guide layer 29a varies in accordance with the depth of the etching performed to the buffer layer, but is adjusted so that the horizontal cross section of the wave-guiding layer 29b which halves the wave-guiding layer 29b and the horizontal cross section of the active layer 23 in each laser oscillation portion 20k in the semiconductor laser region 20b' which halves the active layer 23 are on the same plane.

The lower guide layer 29a, the wave-guiding layer 29b, and the upper guide layer 29c (semiconductor crystal layers) are selectively grown using the SiO$_2$ film, thereby forming a desirable layered structure in which the semiconductor crystals are not grown on the SiO$_2$ film. Moreover, the dielectric film 20h (SiO$_2$ film) formed on the end face of the structure in the semiconductor laser region 20b' suppresses crystal growth in the horizontal direction, whereby an optical connection between the semiconductor laser region 20b' and the input waveguide region 20f' is satisfactorily made.

Thereafter, in the input waveguide region 20f', the MMI region 20a, and the output waveguide region 20c, another SiO$_2$ mask having predetermined patterns of the five input waveguides 20g in the input waveguide region 20f', the MMI region 20a, and the single output waveguide 20e in the output waveguide region 20c is formed by a reduction exposure method.

Figure 9:
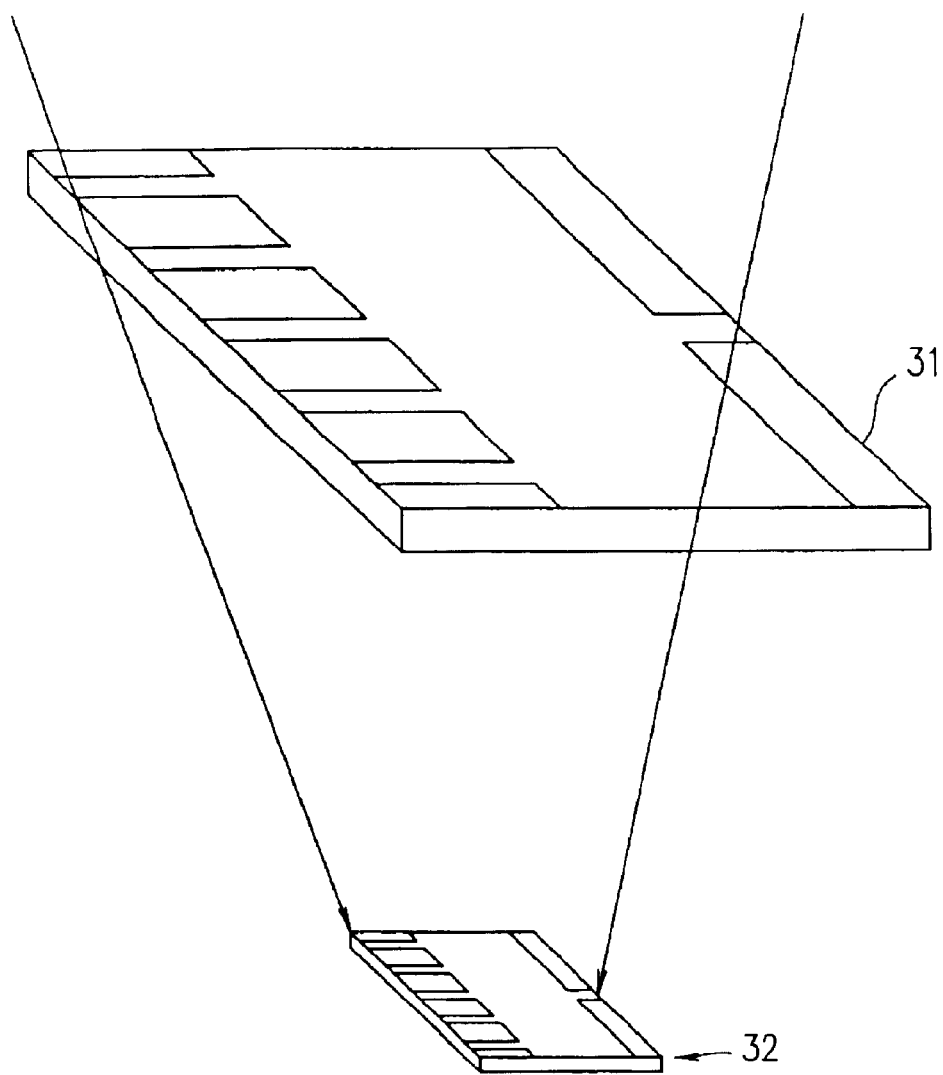
FIG. 9 schematically shows the reduction exposure method utilized in the fabrication of a semiconductor laser element according to embodiment 4 of the present invention.
Figure 12:
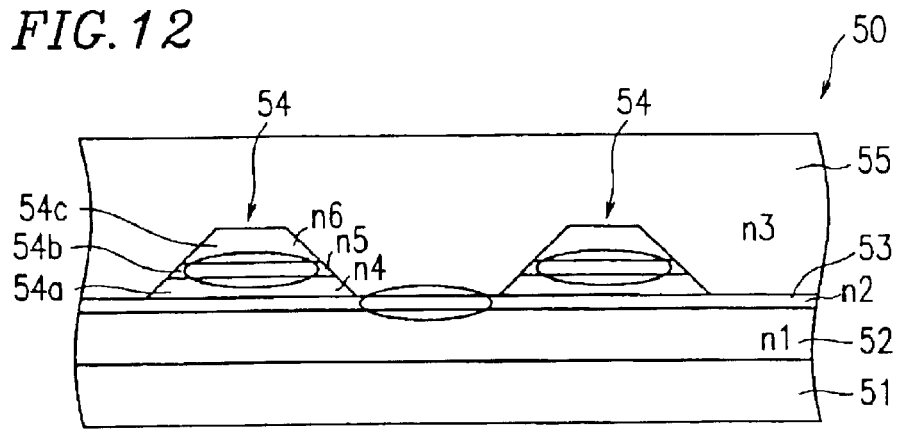
FIG. 12 is a cross-sectional view showing a conventional semiconductor laser element.
Figure 13:
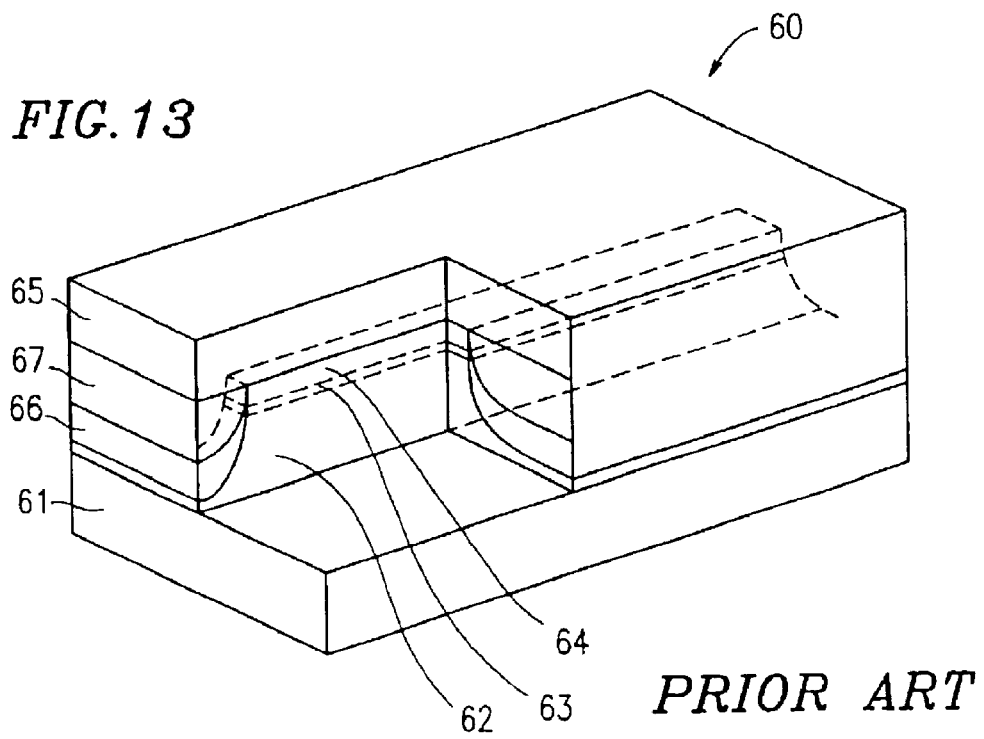
FIG. 13 is a partially cut away, perspective view showing a conventional semiconductor laser element.

By the reduction exposure method, as shown in FIG. 9, the patterns of the input waveguides 20g and the output waveguide 20e formed in a photomask 31, which are larger than the actual sizes thereof, are projected by ultraviolet light onto a semiconductor layered structure 32. According to this technique, the input waveguides 20g can be formed so that the error in the width thereof is 0.05 µm or smaller.

According to the conventional light exposure method, the input waveguide 20g is patterned on the mask so that an error that may occur in the width on the mask is about 0.05 µm. However, the dimensional accuracy for the width of the actually-fabricated input waveguide 20g further decreases. On the other hand, in the reduction exposure method, when the reduction rate is 1/10, the dimensional error of a mask formed on the semiconductor substrate 21 is reduced to a 1/10 of the dimensional error on the photomask 31. That is, the error which may occur in the width of the input waveguide 20g is limited to about 0.005 µm or smaller. Thus, in the case where the width of each input waveguide 20g is varied increasingly or decreasingly by about 0.1 µm, the dimensional error is a 1/20 of this variation. Accordingly, the error which may occur in the phase shift is reduced to a 1/20 of a phase shift error when the reduction exposure method is not used.

After the patterns of the input waveguides 20g in the input waveguide region 20f', the structure in the MMI region 20a, and the output waveguide 20e in the output waveguide region 20c have been formed by the reduction exposure method, the resultant structures are dry etched so that the input waveguide region 20f', the MMI region 20a, and the output waveguide region 20c are formed into the predetermined shapes.

Next, the SiO$_2$ mask is removed from the resultant structure, a negative electrode 26 is provided on the entire lower surface of the semiconductor substrate 21, and a positive electrode 25 is provided over the semiconductor laser region 20b'. Then, a high reflection film is deposited on an end face of each laser emission portion 20k (i.e., an interface between the laser emission portion 20k and air). As well, a reflection film having a low reflectance of about several percentages is deposited on an end face of the output waveguide 20e in the output waveguide region 20c (i.e., an interface between the output waveguide 20e and air). Thus, the semiconductor laser element 20' as shown in FIG. 8 is completed.

One of the requirements for obtaining the maximum output power is that the phase of the laser light is shifted when the laser light enters the MMI region. (See "Applied Optics", Volume 34, no. 30, pp. 6898–6910 (M. Bachmann, et al.). (In this document, only an approximate solution is given.) In an MMI light combining device as shown in FIG. 11, an almost maximum output power is obtained when the phase of light introduced from the i-th input waveguide satisfies the following expression (5).

$$\Phi = (-\pi/N) \cdot (i-1) \cdot (N-1) \qquad (5)$$

In embodiment 4, in the case where the relative phases of light introduced into five input waveguides are (0, −0.6π, −0.8π, −0.6π, 0), respectively, the output power of the laser light is a maximum. It is confirmed in embodiment 4 that when the difference in width between the adjacent input waveguides 20g is 10%, the equivalent refractive index changes by 0.00065. Thus, by changing the widths of each input waveguide 20g by 10% to 0.9 µm, 1.0 µm, 1.1 µm, 1.0 µm, 0.9 µm, respectively, the relative phases of light which propagate in the respective input waveguides 20g are changed to (0, −0.5π, 0, −0.5π, −π). When the phases of light which enters the respective input waveguides 20g, i.e., the phases of light emitted by the respective laser emission portions 20d are (0, −π, 0, −π, 0), the phases of light output from the respective input waveguides 20g are (−π, −1.5π, 0, −1.5π, −π). In addition, when a cycle of 2π is considered, the output phases of light are (0, −0.5π, −π, −0.5π, 0), respectively. Thus, a phase condition near the optimum phase condition can be obtained for light introduced into the MMI region 20a. (It should be noted that the wavelength of laser light emitted by the semiconductor laser element 20' according to embodiment 4 is 800 nm.)

As described above, according to embodiment 4, the equivalent refractive index in each input waveguide 20g is adjusted by changing the width of the respective input waveguide 20g. However, the equivalent refractive index in each input waveguide 20g may also be adjusted by burying an appropriate material in spaces at both sides of the respective input waveguide 20g.

The semiconductor laser element 20' of embodiment 4 emits laser light at a high output rate of 70% with respect to the total optical power of light generated in the laser emission portions 20k in the semiconductor laser region 20b', and produces an ideal emission pattern of the laser light. The 30% optical loss of the laser light is a 10% coupling loss from the laser emission portions 20k in the semiconductor laser region 20b' to the respective input waveguides 20g and a 20% coupling loss from the MMI region 20a to the output waveguide 20e. The principal cause of the 20% coupling loss from the MMI region 20a to the output waveguide 20e is that the phases of laser light cannot be matched with each other in the MMI region 20a. However, if the width of each input waveguide 20g is set to 1 µm and no adjustment is made to the phase, the total optical loss in the entire semiconductor laser element 20' reaches 60%.

Furthermore, it is confirmed that the use of the light propagation method avoids the necessity of equally spacing the input waveguides 20g. In such a case, the position of the input waveguides 20g are adjusted relative to the MMI region 20a without changing the width of the input waveguides 20g, thereby obtaining the same effect as that produced by the phase adjustment.

As described above, the phase adjustment is made by changing the width of each input waveguide 20g based on the approximate solution derived from the article by M. Bachmann, et al. However, by adjustment based on the light propagation method, the phases of light introduced into the MMI region 20a can be adjusted to (0, −0.64π, −0.85π, −0.64π, 0), whereby the optical loss can be substantially reduced to 0%.

The frequency response of the semiconductor laser element 20' according to embodiment 4 was measured. The measurement showed that the electrostatic capacity in each laser emission portion 20k was as small as about 10 pF, and when the frequency transfer function of the entire semiconductor laser element 20' decreased by 3 dB, the frequency was about 2 GHz, which is significantly satisfactory.

In the semiconductor laser element 20' according to embodiment 4, since the wave-guiding layer 29b included in the input waveguides 20g, the MMI region 20a, and the output waveguide 20e are made of AlGaAs which is not optically absorptive, the oscillation threshold current is low, and therefore, the semiconductor laser element 20' can be driven by a small current.

Thus, the semiconductor laser element 20' according to embodiment 4 produces a high power laser light, and realizes a high speed modulation. Furthermore, the optical emission pattern thereof is almost perfectly circular. In addition, the semiconductor laser element 20' can operate at 200 mW for about 100,000 hours, and offers high reliability.

In the above embodiments of the present invention, the semiconductor laser element is a monolithic type semiconductor laser element in which a semiconductor laser region and an MMI region are integrally provided on a single semiconductor substrate 21. However, the semiconductor laser element of the present invention may be a hybrid type or a bulk type.

Furthermore, the number of the laser oscillation portions (laser emission portions) is not limited to a specific number. Furthermore, the laser oscillation portions may be arranged so as not to be symmetrical with respect to the center line of the MMI region.

Furthermore, the dimensions of the semiconductor laser elements shown in the embodiments of the present invention are merely exemplary dimensions, and are not limited thereto.

Furthermore, the laser light described in the embodiments of the present invention is not limited to electromagnetic waves in the visible range.

Further still, in the above embodiments of the present invention, there is not any particular need to provide an output waveguide because the guided light is in a single mode at the end of the MMI region adjacent to the output waveguide region. However, in the case where an output waveguide is provided, the semiconductor laser element can be cleaved at any position in the output waveguide. Therefore, the production yield of the semiconductor laser elements improves. Moreover, the number of output waveguides is not limited to one, and a plurality of output waveguides which is smaller in number than the laser oscillation portions (or the laser emission portions) which emit light into the MMI region may be provided.

The structure of the laser oscillation portion in the semiconductor laser region is not limited to that of the BH laser, but may be a V-groove buried laser structure, a ridge current constriction laser structure, etc. In any suitable laser structure, the transfer function (modulation characteristic) of the entire laser element is determined based on the electrostatic capacity in each laser oscillation portion. However, modulation can be performed faster than in a commonly-employed broad area laser, and in addition, the high power output and the almost perfectly circular emission pattern can be obtained.

FIG. 10A shows a personal computer 40 which has a transmission device 43 using a semiconductor laser element according to the present invention. This personal computer 40 is a laptop type computer, which includes a body 41 having an input interface portion provided with a keyboard, etc., and a cover 42 hingedly attached to the body 41. The cover 42 has a display screen, and the transmission device 43 provided on one side thereof.

The transmission device 43 modulates a data signal received from the body 41 of the personal computer 40 to laser light, and outputs the laser light to air. The laser light output to air is received by a personal computer having a receiving device, an optical communication hub, etc., whereby data transmission is achieved.

FIG. 10B is a cross-sectional view of an optical transmission device 43. In this optical transmission device 43, an IC 43b for signal modulation is mounted on a circuit substrate 43a, by which a digital signal received from the body 41 of the personal computer 40 is converted to a signal for modulation. The semiconductor laser element 10 of the present invention is mounted on the circuit substrate 43a, and an electrode 43c is provided in the vicinity of the semiconductor laser element 10. The semiconductor laser element 10 receives the signal modulated by the IC 43b for signal modulation through the electrode 43c, and is driven by the modulated signal.

The semiconductor laser element 10 is covered with a laser protection cover 43d to which a light diffusing plate 43e is attached. Laser light emitted by the semiconductor laser element 10 passes through the light diffusing plate 43e. The light diffusing plate 43e diffuses laser light emitted by the semiconductor laser element 10 which passes therethrough so that the laser light does not hurt a human body, especially the retina.

The laser protection cover 43d is covered with a resin mold lens 43f, through which laser light emitted by the semiconductor laser element 10 and transmitted through the light diffusing plate 43e is output to air. Particles which diffuse light are mixed in the resin mold lens 43f, and therefore, the resin mold lens 43f also has a function that prevents laser light from hurting the retina.

In the personal computer 40 having the optical transmission device 43, the semiconductor laser element 10 mounted in the optical transmission device 43 has a lifetime significantly longer than that of a conventional semiconductor laser element, and is used stably for a substantially long term. Because of the long lifetime of the semiconductor laser element 10, the personal computer 40 can be used for a substantially long term before the lifetime of the semiconductor laser element 10 ends. Thus, the reliability of the personal computer 40 using the semiconductor laser element 10 of the present invention significantly improves because the lifetime of the personal computer is determined by the emission element whose lifetime is shortest amongst the components of the personal computer 40.

The semiconductor laser element 10 of the present invention does not use any special lenses because it emits an almost perfectly circular laser light. Thus, the resin mold lens 43f, which is inexpensive and can be readily fabricated, may be employed. Accordingly, the cost of the product as a whole and the weight of the product can be reduced.

It should be noted that the semiconductor laser element 10', 20, or 20' (FIGS. 5, 6, and 8, respectively) can be used in place of the semiconductor laser element 10. Furthermore, the semiconductor laser element of the present invention is not limited to use in a personal computer 40, but can be used in any device for optical transmission such as a video camera for video transmission, etc.

As described hereinabove, the semiconductor laser element of the present invention includes a semiconductor laser region, a MMI region, and an output waveguide region inside a laser resonator. The semiconductor laser element having such a structure produces a single mode emission, high power output, and is highly reliable.

Furthermore, the semiconductor laser region including a plurality of emission portions or laser oscillation portions and the MMI region in which light or laser light emitted by the emission portions (or by the laser oscillation portions) interfere with each other so as to obtain a single mode laser light are formed integrally. Therefore, a high output power, single mode radial light can be obtained, and the electrostatic capacitance in each emission portion or each laser oscillation portion can be reduced. Thus, the semiconductor laser element of the present invention can perform a high speed modulation.

The semiconductor laser element of the present invention can be suitably used as a light source for wireless optical transmission. An electronic device using such a semiconductor laser element can be used stably for a long term because the semiconductor laser element has a long lifetime.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor laser element, comprising:
    a semiconductor laser region including a plurality of laser emission portions each having the same construction relative to one another and arranged side by side in a parallel array and having a common modulation electrode traversing and covering only the laser emission portions, each of said laser emission portions including an active layer for emitting light;
    a multimode interference region including a first wave-guiding layer;
    an input waveguide region located between the semiconductor laser region and the multimode interference region, said input waveguide region including a plurality of wave-guiding portions where all the wave-guiding portions are equal length in an optical direction; and
    an output waveguide region including a second wave-guiding layer, the second wave-guiding layer being optically coupled to an opposite end of the first wave-guiding layer of the interference region, wherein the material comprising the first wave-guiding layer is different from that of the active layers of the laser emission portions.

2. A semiconductor laser element according to claim 1, wherein the semiconductor laser region, the multimode interference region, and the output waveguide region are provided on a same semiconductor substrate.

3. A semiconductor laser element according to claim 2, further comprising:
    a first electrode provided on a lower surface of the semiconductor substrate; and
    said common electrode being located on an upper surface of the semiconductor laser region.

4. A semiconductor laser element according to claim 3, further comprising a third electrode provided over at least one of the output waveguide region and at least a portion of the multimode interference region.

5. A semiconductor laser element according to claim 4, wherein a bias voltage is applied to the third electrode.

6. A semiconductor laser element according to claim 2, further comprising:
    a first electrode provided on a lower surface of the semiconductor substrate; and
    a fourth electrode provided at least on a upper surface of the multimode interference region.

7. A semiconductor laser element according to claim 1, wherein, the first wave-guiding layer of the multimode interference region, and the second wave-guiding layer of the output waveguide region are integrally formed of a same type of semiconductor material.

8. A semiconductor laser element according to claim 1 wherein the plurality of waveguide portions of the input waveguide region located between the semiconductor laser region and the interference region, include a plurality of mutually spaced apart substantially equal length third wave-guiding layers for optically coupling the active layers of the plurality of laser emission portions and the first wave-guiding layer of the multimode interference region.

9. A semiconductor laser element according to claim 8, wherein the first wave-guiding layer, and the plurality of the third wave-guiding layers are integrally formed of the same material.

10. A semiconductor laser element according to claim 8, wherein the first wave-guiding layer and the plurality of third wave-guiding layers are comprised of low optical absorption material.

11. A semiconductor laser element according to claim 10, wherein the first wave-guiding layer and the plurality of third wave-guiding layers are formed of AlGaAs.

12. An electronic device comprising the semiconductor laser element of claim 1, wherein the electronic device supplies a modulation signal to the semiconductor laser element.

13. A semiconductor laser element, comprising:
   a semiconductor laser region including a plurality of laser emission portions each having the same construction relative to one another, arranged side by side, and having a common modulation electrode traversing all of the laser emission portions and covering only the laser emission portions for operating said laser emission portions in a single mode, each of said laser emission portions also having an active layer which performs laser operations at a same wavelength;
   a multimode interference region including a first wave-guiding layer coupled to said laser emission portions via an input waveguide region including a plurality of parallel equal length waveguides having respective second wave-guiding layers where all the waveguides are equal in length in an optical direction;
   an output waveguide region including a third wave-guiding layer coupled to said second wave-guiding layers;
   wherein the material comprising the plurality of second wave-guiding layers is different from that of the active layers of the laser emission portions and wherein the active layer of the plurality of laser emission portions, the first guiding layer of said multimode interference region, the second wave-guiding layers of the input waveguide region, and the third wave-guiding layer of the output waveguide region are formed on a common substrate.

14. A semiconductor laser element according to claim 13, wherein:
   a dielectric film is provided between the plurality of active layers of the laser region and the plurality of second wave-guiding layers of the input waveguide region; and
   wherein the plurality of active layers of the laser region and the plurality of second wave-guiding layers of input waveguide regions are optically coupled to each other through the dielectric film.

15. A semiconductor laser element according to claim 13, wherein the first wave-guiding layer and the plurality of second wave-guiding layers are comprised of the same material having a low light absorption.

16. A semiconductor laser element according to claim 15, wherein the first wave-guiding layer and the plurality of second wave-guiding layers are comprised of AlGaAs.

17. A semiconductor laser element according to claim 13, wherein each of the plurality of second wave-guiding layers of the input waveguide region has a predetermined equivalent refractive index.

18. A semiconductor laser element according to claim 13, wherein each of the plurality of second wave-guiding layers has a predetermined width.

19. A semiconductor laser element according to claim 18, wherein a manufacturing accuracy in the width of each of the plurality of second wave-guiding layers with respect to the predetermined width is 0.05 μm or smaller.

20. A semiconductor laser element according to claim 13, wherein the geometric pattern of the plurality of second wave-guiding layers is made by a reduction exposure method.

21. An electronic device including the semiconductor laser element of claim 13, which outputs a modulated signal to the semiconductor laser element.

* * * * *